(12) United States Patent
Ziarnik et al.

(10) Patent No.: US 7,401,644 B2
(45) Date of Patent: Jul. 22, 2008

(54) COMPUTER SYSTEMS AND RELATED METHODS FOR COOLING SUCH SYSTEMS

(75) Inventors: Gregory P. Ziarnik, Houston, TX (US); Mark D. Tupa, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 695 days.

(21) Appl. No.: 10/810,961

(22) Filed: Mar. 26, 2004

(65) Prior Publication Data
US 2005/0211426 A1    Sep. 29, 2005

(51) Int. Cl.
*G05D 23/00* (2006.01)

(52) U.S. Cl. .............. 165/287; 165/121; 236/49.3; 318/400.01; 361/695; 713/300

(58) Field of Classification Search ............... 165/121, 165/287; 236/49.3; 318/400.01; 361/695; 700/300; 702/132; 713/300
See application file for complete search history.

(56) References Cited

U.S. PATENT DOCUMENTS

| | | | |
|---|---|---|---|
| 5,249,741 A * | 10/1993 | Bistline et al. ............. 236/49.3 |
| 6,029,251 A | 2/2000 | Williams et al. |
| 6,356,581 B1 | 3/2002 | Nguyen et al. |
| 6,392,372 B1 * | 5/2002 | Mays, II ............... 318/400.01 |
| 6,414,843 B1 * | 7/2002 | Takeda ...................... 165/121 |
| 6,470,289 B1 * | 10/2002 | Peters et al. ................ 702/132 |
| 6,480,550 B1 | 11/2002 | Zimmermann |
| 6,545,438 B1 * | 4/2003 | Mays, II ............... 318/400.01 |
| 6,622,253 B2 | 9/2003 | Bacon |
| 6,873,883 B2 * | 3/2005 | Ziarnik ...................... 700/300 |
| 6,889,762 B2 * | 5/2005 | Zeigler et al. .............. 236/49.3 |
| 7,272,732 B2 * | 9/2007 | Farkas et al. ................ 713/300 |
| 2002/0152406 A1* | 10/2002 | Watts et al. ................. 713/300 |
| 2003/0120394 A1* | 6/2003 | Ziarnik ...................... 361/695 |
| 2005/0216221 A1* | 9/2005 | Broyles et al. ............. 702/132 |

* cited by examiner

*Primary Examiner*—Ljiljana (Lil) V Ciric

(57) ABSTRACT

Methods and systems for cooling computer systems, in which the computer system has a processor and a fan. An exemplary method includes: determining a temperature threshold for operating the fan at greater than low speed; determining a temperature of the computer system; and throttling the processor if the determined temperature corresponds to the temperature threshold for operating the fan at greater than low speed.

13 Claims, 5 Drawing Sheets

COMPUTER SYSTEMS AND RELATED METHODS FOR COOLING SUCH SYSTEMS

BACKGROUND

Components of computer systems, such as processors, generate heat during operation. Since the performance of such components can be degraded and/or damage can result to these components due to exposure to high temperatures, the heat generated during operation typically must be dissipated. In this regard, several approaches have been used for cooling computer systems.

By way of example, some computer systems use a fixed cooling solution that involves operating a fan to provide a maximum flow of cooling air across any heat generating components of the computer system. Unfortunately, such a solution tends to create a continuous and substantial amount of noise related to the operation of the fan.

Other computer systems implement an active cooling solution that also involves the use of a fan. However, in contrast to the fixed cooling solution, this fan is only operated to provide maximum cooling flow, i.e., operated at high speed, when needed. Thus, noise associated with operation of the fan only increases when the fan is required to provide an increased flow of cooling air.

SUMMARY

Systems and methods for cooling computer systems are provided, in which the computer system has a processor and a fan. An embodiment of such a method comprises: determining a temperature threshold for operating the fan at greater than low speed; determining a temperature of the computer system; and throttling the processor if the temperature corresponds to the temperature threshold for operating the fan at greater than low speed.

Another embodiment of such a method comprises: operating the fan at a first acoustic level; determining power usage of the computer system; throttling the processor if the power usage corresponds to operating the fan at an increased acoustic level such that the processor is throttled to cool the computer system prior to operating the fan at the increased acoustic level.

An embodiment of such a computer system comprises a processor, a fan and a temperature-monitoring unit. The fan is operative to provide cooling airflow for reducing a temperature of the processor and has a temperature threshold corresponding to operation of the fan at a speed greater than low speed. The temperature-monitoring unit is operative to determine a temperature of the computer system and to throttle the processor if the temperature corresponds to the temperature threshold for operating the fan at greater than low speed.

Another embodiment of such a computer system comprises a power-monitoring unit that comprises: logic configured to determine a temperature threshold for operating the fan at greater than low speed; logic configured to determine a temperature of the computer system; and logic configured to throttle the processor if the temperature corresponds to the temperature threshold for operating the fan at greater than low speed.

BRIEF DESCRIPTION OF THE DRAWINGS

The components in the drawings are not necessarily to scale relative to each other. Like reference numerals designate corresponding parts throughout the several views.

DETAILED DESCRIPTION

Computer systems and related methods for cooling such systems are provided. As will be described in detail here, an exemplary embodiment of such a computer system provides a reduced acoustic output compared to prior art systems. This is because as the power usage, e.g., temperature, of the computer system increases, the processor is throttled. Specifically, the processor is throttled to prevent a fan of the computer system from operating at a high speed. By throttling the processor, power required by the processor is reduced so that the processor does not generate as much heat. Typically, this can be accomplished while providing a negligible impact on system performance as perceived by a user. Beneficially, by reducing the operating temperature of the processor, the fan can be operated at a lower speed with a lower acoustic output.

Figure 1:
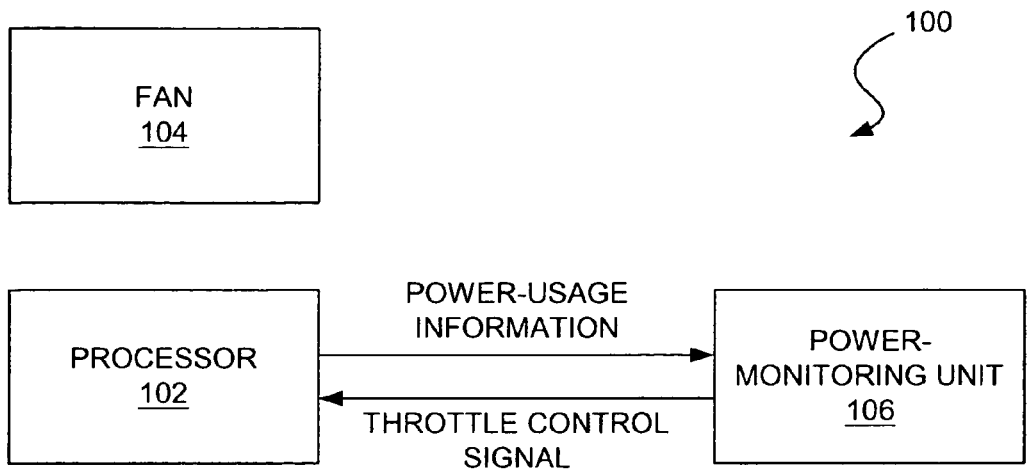
FIG. 1 is a schematic diagram of an embodiment of a computer system.

Referring now to the drawings, FIG. 1 is a schematic diagram of an embodiment of a computer system 100. Computer system 100 includes a processor 102, e.g. a central processing unit, and a fan 104 that is operative to provide a cooling flow of air for cooling processor 102. Fan 104 is a variable speed fan, e.g., a continuously variable fan, although, in other embodiments, a single-speed fan that is operated intermittently could be used.

Also included in computer system 100 is a power-monitoring unit 106. Power-monitoring unit 106 is operative to determine a power usage corresponding to the computer system 100. In particular, the power-monitoring unit 106 receives power usage information associated with processor 102. In response to receiving the power usage information, the power-monitoring unit 106 determines whether processor 102 should be throttled. That is, a determination is made as to whether the processor 102 should be operated in a reduced performance and power consumption mode. If the processor is to be throttled, the power-monitoring unit 106 provides a throttle control signal to processor 102 for controlling throttling of the processor. Various techniques for throttling a processor are known, such as described in U.S. Pat. No. 6,029,251, which is incorporated by reference herein; therefore, a more detailed description of throttling will not be provided here.

In the embodiment of FIG. 1, power-monitoring unit 106 attempts to control the power usage of processor 102 by throttling the processor prior to the computer system attaining a temperature that causes fan 104 to operate at high speed. Throttling the processor in this manner prevents the fan from generating noise at an increased acoustic level compared to the acoustic level generated when the fan is operating at low speed.

Figure 2:
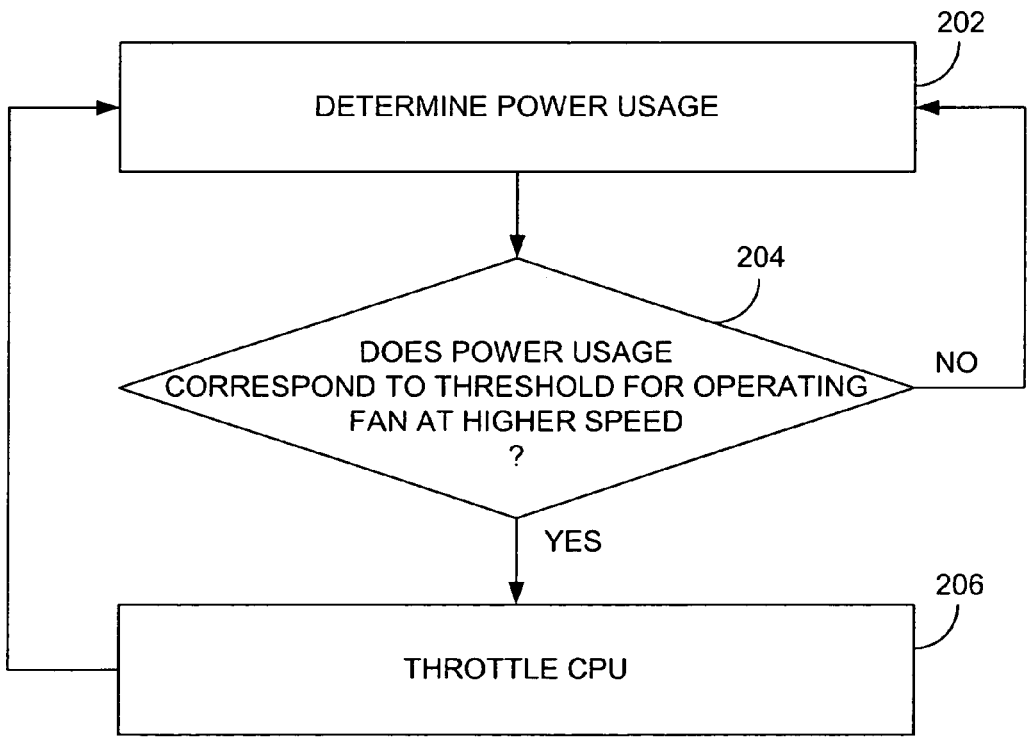
FIG. 2 is a flowchart depicting functionality of the power-monitoring unit of FIG. 1.

FIG. 2 is a flowchart depicting functionality of the embodiment of the power-monitoring unit of FIG. 1. As shown in FIG. 2, the functionality (or method) may be construed as beginning at block 202, where power usage of the computer system, e.g., power usage of a processor of the computer system, is determined. In block 204, a determination is made as to whether the power usage corresponds to a threshold for operating the fan at a higher speed. If it is determined that the power usage corresponds to the threshold for operating the fan at the higher speed, the processor is throttled as depicted in block 206. If, however, the power usage does not correspond to the threshold, the process may return to block 202 and proceed as described before.

Figure 3:
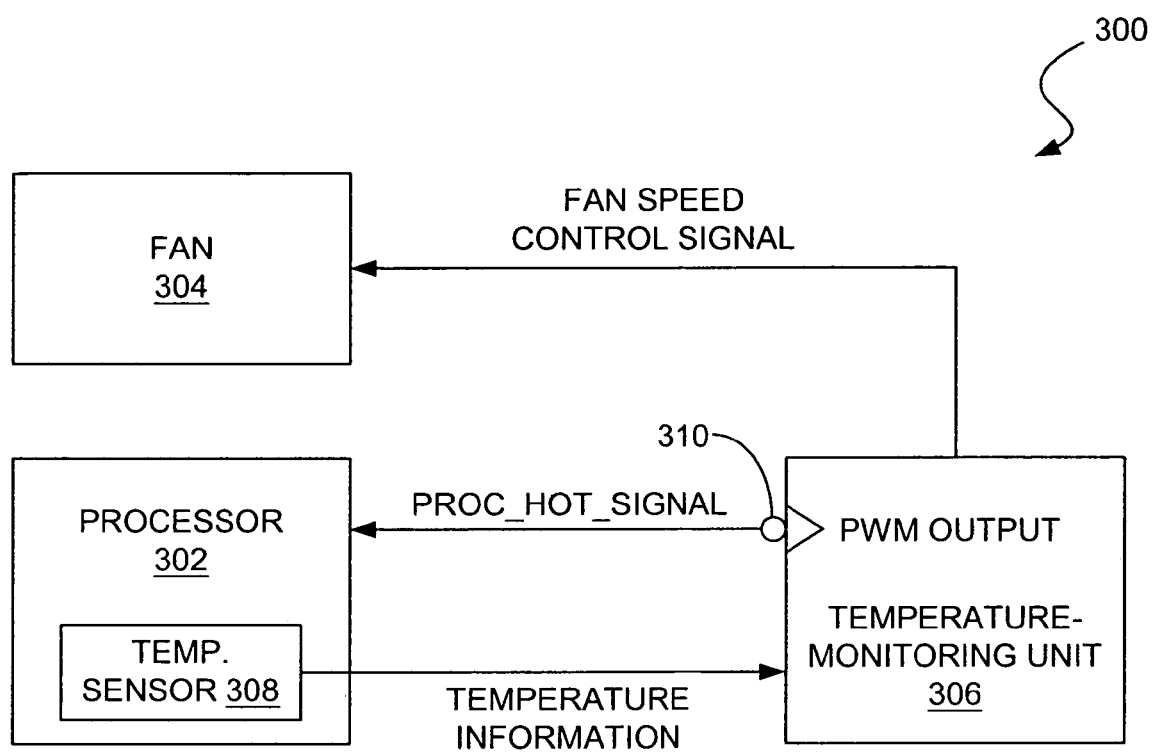
FIG. 3 is a schematic diagram of another embodiment of a computer system.

FIG. 3 is a schematic diagram of another computer system, specifically, a computer system 300. Computer system 300 includes a processor 302 and a fan 304. Computer system 300 also includes a type of power-monitoring unit, in particular, a temperature-monitoring unit. The temperature-monitoring unit 306 is considered a type of a power-monitoring unit because temperature typically corresponds to power usage of a computer system.

In operation, temperature information is provided from a temperature sensor 308, e.g., a thermal diode, of the processor to the temperature-monitoring unit 306. In response to the temperature information, temperature-monitoring unit 306 provides a pulse width modulation (PWM) output to the processor for controlling throttling of the processor. Specifically, the PWM output is provided to the PROC_HOT_SIGNAL input of the processor 302. PWM output will be described in greater detail later with respect to FIG. 4. Note that in the embodiment of FIG. 3, the PWM output is provided first to an inverter 310 and then to processor 302.

The temperature-monitoring unit 306 provides a fan speed control signal to fan 304. Thus, in this embodiment, the temperature-monitoring unit controls processor throttling and fan speed. For example, if throttling of the processor 302 is unable to maintain the temperature at or below a high temperature threshold, the fan speed control signal provided by the temperature-monitoring unit can adjust the fan to operate at a higher speed. Typically, however, the temperature-monitoring unit ensures that throttling is accomplished prior to allowing the fan to operate at a speed other than low speed, thereby maintaining the acoustic level of the fan at a low level.

Figure 4:
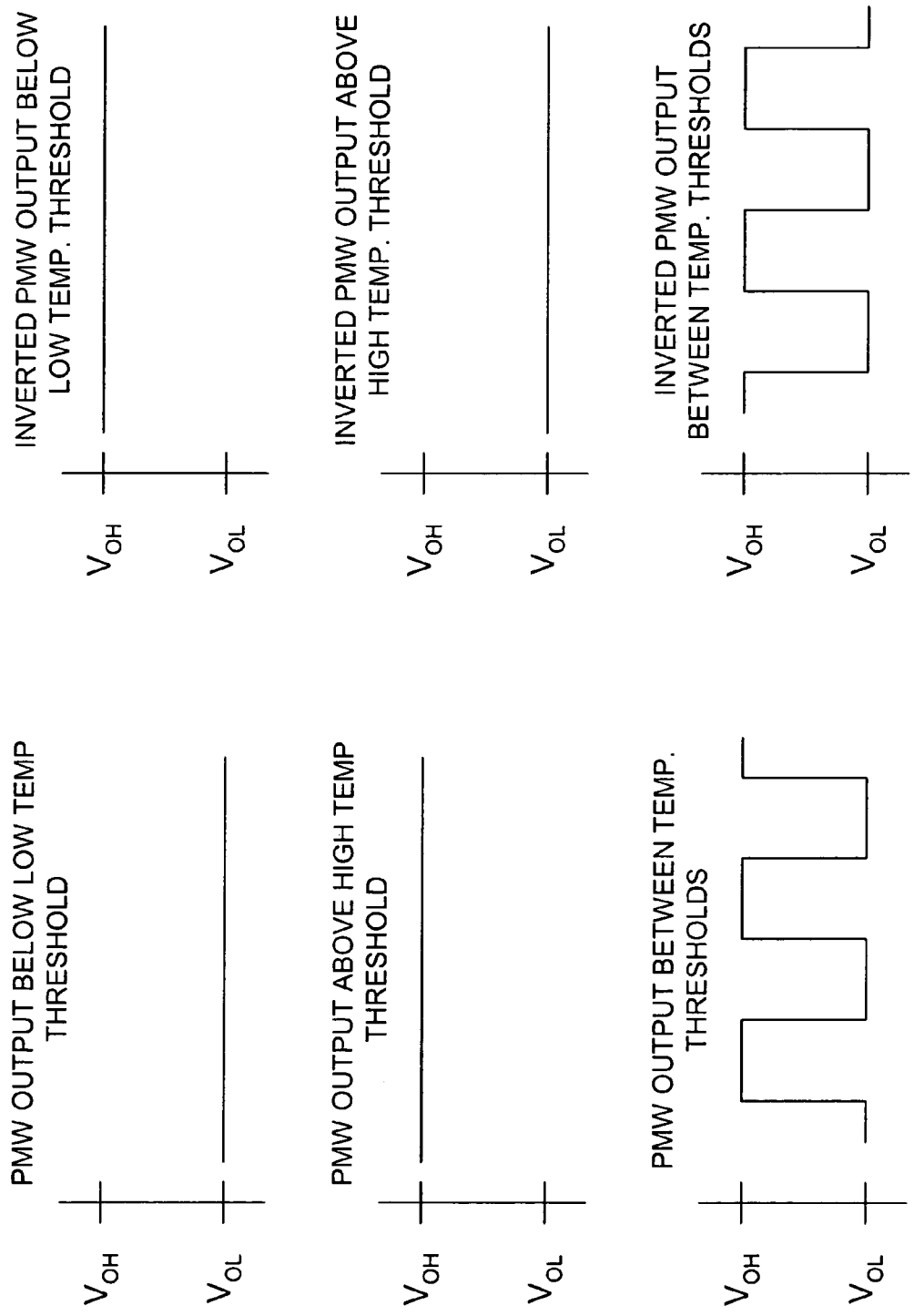
FIG. 4 is a set of graphs depicting various signals provided by the embodiment of FIG. 3.

FIG. 4 depicts a set of graphs related to the PWM output of the temperature-monitoring unit 306. Specifically, the first graph depicts the PMW output of the temperature-monitoring unit when the temperature information corresponds to a temperature below an established low temperature threshold. As can be seen, when the temperature is below the low temperature threshold, the voltage of the PWM output is high. In contrast, when the temperature information corresponds to a temperature above a high temperature threshold, the PMW output is a low voltage. Moreover, when the temperature is between the high temperature and low temperature thresholds, the PMW output alternates between the high voltage and low voltage levels with the duration of the voltage levels present in the waveform corresponding to the temperature. In the example depicted, the output corresponds to a temperature halfway between the high temperature threshold and the low temperature threshold, thus, the voltage of the waveform is high for fifty percent of the time and low for the other fifty percent.

The graphs to the right side of FIG. 4 depict the output of the inverter 310. The original PWM output is inverted because throttling of the processor is active when a low voltage PROC_HOT_SIGNAL is received. That is, a sensed high temperature produces a high output PWM signal, which is then inverted and provided as a low voltage signal to cause the processor to be throttled.

Figure 5:
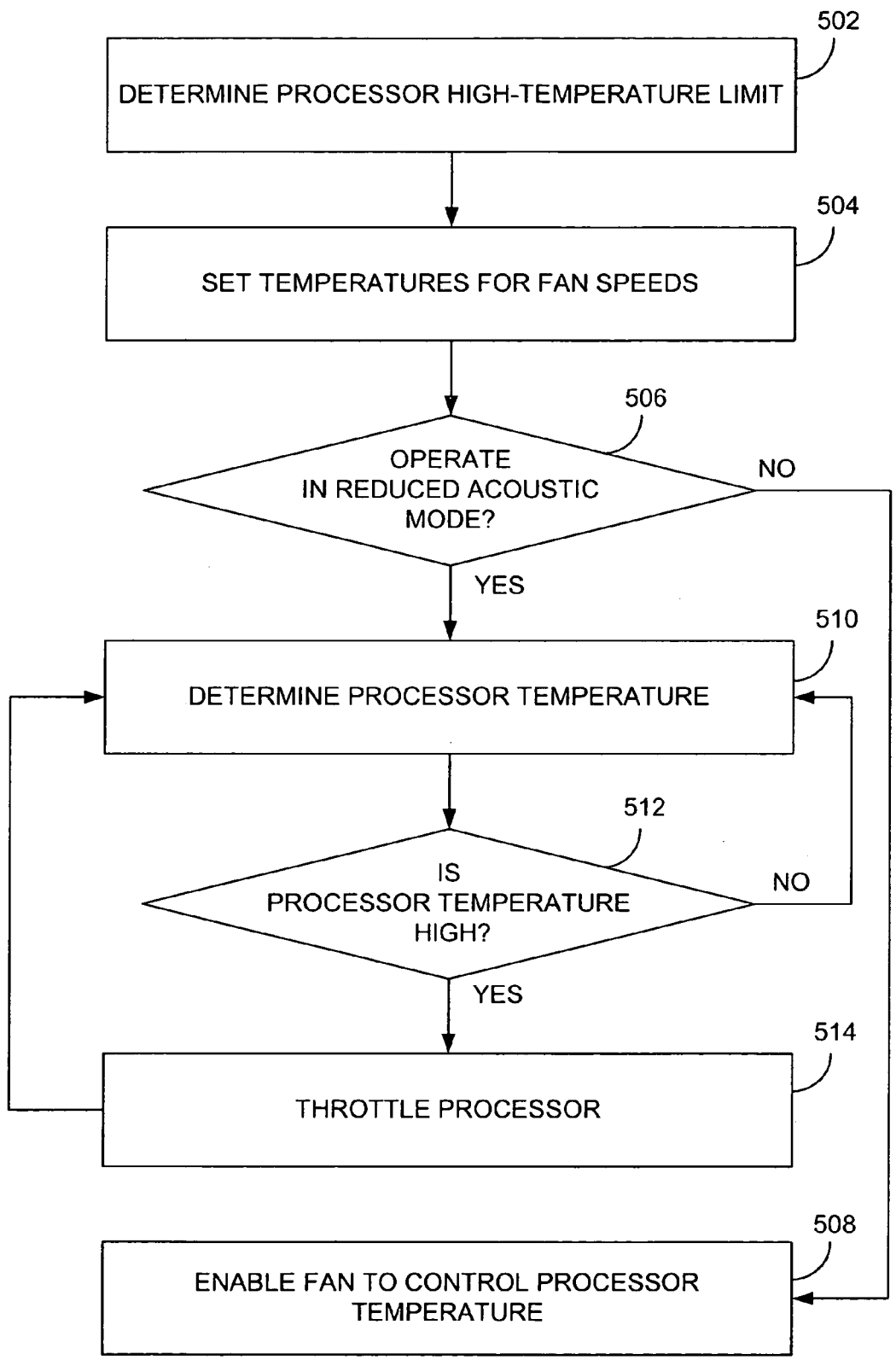
FIG. 5 is a flowchart depicting an embodiment of a method for cooling a computer system.

FIG. 5 is a flowchart depicting functionality of another embodiment of a computer system. As shown in FIG. 5, the process may be construed as beginning at block 502, where a high temperature limit of a processor of the computer system is determined. In block 504, temperatures at which various fan speeds are to be actuated are set. By way of example, with respect to a two-speed fan, the temperature at which the fan is to transition from low speed operation to high speed operation can be set. In block 506, a determination is made as to whether the system is to operate in a reduced acoustic mode. If the system is not to operate in the reduced acoustic mode, the process may proceed to block 508, where the fan is enabled to control the processor temperature. If, however, the system is to operate in a reduced acoustic mode, the process may proceed to block 510.

In block 510, a temperature corresponding to the processor is determined. Then, as depicted in block 512, a determination is made as to whether the temperature corresponds to the previously determined high temperature limit of the processor. If the temperature is not high, the process may return to block 510. If, however, the temperature is determined to be high, the process may proceed to block 514, where the processor is throttled. After throttling the processor, the process also may return to block 510 and proceed as described before.

Note that various techniques can be used for determining whether the system is to operate in a reduced acoustic mode. For example, the determination could be made in response to a user input provided during BIOS setup of the computer system.

Power monitoring units, e.g. power-monitoring unit 106, can be implemented in software, firmware, hardware, or a combination thereof. When implemented in hardware, such a unit can be implemented with any or a combination of various technologies. By way of example, the following technologies, which are each well known in the art, can be used: a discrete logic circuit(s) having logic gates for implementing logic functions upon data signals, an application specific integrated circuit (ASIC) having appropriate combinational logic gates, a programmable gate array(s) (PGA), and a field programmable gate array(s) (FPGA).

In alternative embodiments, a power-monitoring unit could be implemented in software as an executable program (s). When implemented in software, it should be noted that the power-monitoring unit can be stored on any computer-readable medium for use by or in connection with any computer-related system or method. In the context of this document, a computer-readable medium is an electronic, magnetic, optical, or other physical device or means that can contain or store a computer program for use by or in connection with a computer-related system or method. A power-monitoring unit can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

It should be noted that, in some alternative implementations, the functions noted in the various blocks of this and/or other flowcharts depicted in the accompanying disclosure may occur out of the order depicted. For example, two blocks shown in succession in FIG. 5 may be performed concurrently.

Figure 6:
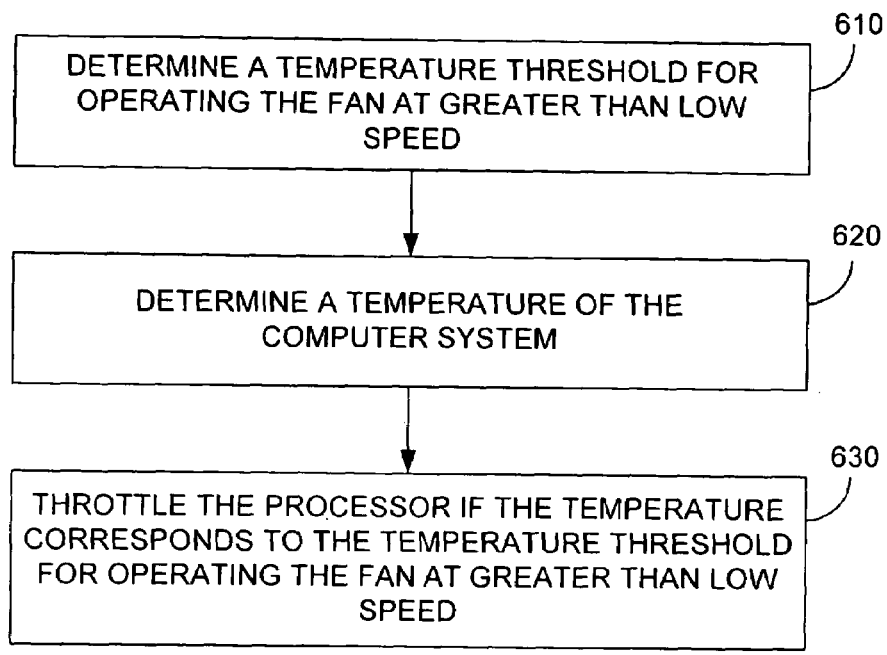
FIG. 6 is a flowchart depicting another embodiment of a method for cooling a computer system.

FIG. 6 is a flowchart depicting another embodiment of a method for cooling a computer system. In particular, the computer system incorporates a processor and a fan. As shown in FIG. 6, the method may be construed as beginning at block 610, where a temperature threshold for operating the fan at greater than low speed is determined. At block 620, a temperature of the computer system is determined. At block 630, the processor is throttled if the temperature corresponds to the temperature threshold for operating the fan at greater than low speed.

Figure 7:
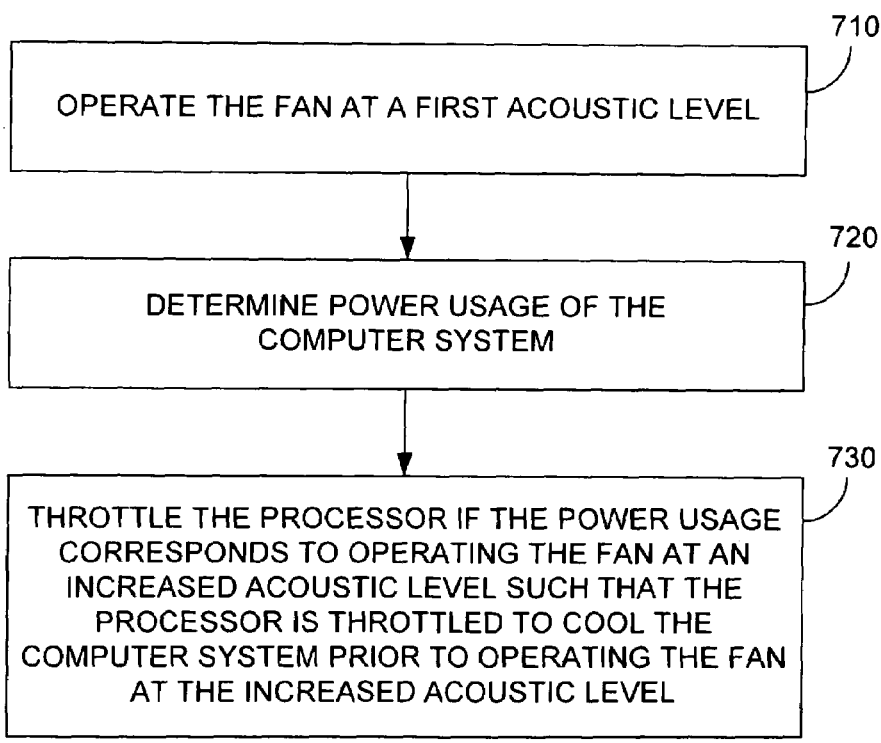
FIG. 7 is a flowchart depicting another embodiment of a method for cooling a computer system.

FIG. 7 depicts another embodiment of a method for cooling a computer system. Specifically, this embodiment also involves a computer system that includes a processor and a fan. As shown in FIG. 7, the method may be construed as beginning at block 710, where the fan is operated at a first acoustic level. At block 720, power usage of the computer system is determined. At block 730, the processor is throttled if the power usage corresponds to operating the fan at an increased acoustic level such that the processor is throttled to cool the computer system prior to operating the fan at the increased acoustic level.

It should be emphasized that many variations and modifications may be made to the above-described embodiments. All such modifications and variations are intended to be included herein within the scope of this disclosure and protected by the following claims.

The invention claimed is:

1. A method for cooling a computer system, the computer system having a processor and a fan, said method comprising:
   determining a temperature threshold for operating the fan at greater than low speed;
   determining a temperature of the computer system; and
   throttling the processor, responsive to a pulse width modulated signal, if the determined temperature corresponds to the temperature threshold for operating the fan at greater than low speed.

2. The method of claim 1, further comprising:
   determining a high-temperature threshold for the computer system; and
   beginning the throttling of the processor prior to the temperature of the computer system exceeding the high-temperature threshold.

3. The method of claim 2, further comprising:
   operating the fan at greater than low speed if the throttling is inadequate to maintain the temperature of the computer system below the high-temperature threshold.

4. The method of claim 2, wherein the high-temperature threshold for the computer system is a high-temperature threshold for the processor.

5. The method of claim 2, wherein the fan is a continuously variable fan; and
   wherein operating the fan at greater than low speed involves operating the fan at a highest speed of the fan.

6. A computer system comprising:
   a processor;
   a fan operative to provide cooling airflow for reducing a temperature of the processor, the fan having a temperature threshold corresponding to operation of the fan at a speed greater than low speed; and
   a temperature-monitoring unit operative to determine a temperature of the computer system and to throttle the processor if the temperature determined corresponds to the temperature threshold for operating the fan at greater than low speed; and
   wherein the temperature-monitoring unit is configured to throttle the processor by providing a signal corresponding to a pulse width modulation output of the temperature-monitoring unit to the processor.

7. The system of claim 6, wherein:
   the processor has a temperature sensor operative to generate a signal indicative of a temperature of the processor; and
   the temperature-monitoring system receives the signal generated by the temperature sensor for determining the temperature of the computer system.

8. The system of claim 6, wherein the temperature sensor is a thermal diode.

9. The system of claim 6, further comprising:
   an inverter arranged to receive the pulse width modulation output of the temperature-monitoring unit such that the processor receives the inverse of the pulse width modulation output.

10. The system of claim 6, wherein the temperature-monitoring unit is selectively operative in one of a reduced-acoustic mode and a normal-acoustic mode such that:
    in the normal-acoustic mode, the temperature-monitoring unit attempts to control the temperature of the computer system by adjusting the speed of the fan; and
    in the reduced-acoustic mode, the temperature-monitoring unit attempts to control the temperature of the computer system by throttling the processor.

11. The system of claim 10, wherein, in the normal-acoustic mode, if the temperature-monitoring unit is unable to control the temperature of the computer system by adjusting the speed of the fan, the temperature-monitoring unit also throttles the processor.

12. The system of claim 10, wherein, in the reduced-acoustic mode, if the temperature-monitoring unit is unable to control the temperature of the computer system by throttling the processor, the temperature-monitoring unit also adjusts the speed of the fan.

13. A computer system comprising:
    a processor;
    a fan for cooling the processor;
    means for determining a temperature threshold for operating the fan at greater than low speed;
    means for determining a temperature of the computer system; and
    means for throttling the processor, responsive to a pulse width modulated signal, if the determined temperature corresponds to the temperature threshold for operating the fan at greater than low speed.

* * * * *